(12) United States Patent
Fu et al.

(10) Patent No.: US 11,435,389 B2
(45) Date of Patent: Sep. 6, 2022

(54) ELECTRICAL CONTROL DEVICE DETECTION CIRCUIT, DETECTION METHOD, AND ELECTRIC VEHICLE

(71) Applicant: CONTEMPORARY AMPEREX TECHNOLOGY CO., LIMITED, Ningde (CN)

(72) Inventors: Yanhui Fu, Ningde (CN); Baohai Du, Ningde (CN); Guoxiu Wu, Ningde (CN)

(73) Assignee: CONTEMPORARY AMPEREX TECHNOLOGY CO., LIMITED, Ningde (CN)

( * ) Notice: Subject to any disclaimer, the term of this patent is extended or adjusted under 35 U.S.C. 154(b) by 0 days.

(21) Appl. No.: 17/491,110

(22) Filed: Sep. 30, 2021

(65) Prior Publication Data

US 2022/0018885 A1 Jan. 20, 2022

Related U.S. Application Data

(63) Continuation of application No. PCT/CN2020/110651, filed on Aug. 22, 2020.

(30) Foreign Application Priority Data

Aug. 30, 2019 (CN) .......................... 201910816907.8

(51) Int. Cl.
*G01R 31/00* (2006.01)
*B60L 3/00* (2019.01)
*G01R 31/52* (2020.01)

(52) U.S. Cl.
CPC .......... *G01R 31/006* (2013.01); *B60L 3/0046* (2013.01); *G01R 31/52* (2020.01)

(58) Field of Classification Search
None
See application file for complete search history.

(56) References Cited

U.S. PATENT DOCUMENTS

| 6,621,270 B2 | 9/2003 | Johnson et al. |
| 2012/0161817 A1* | 6/2012 | Kanayama ........... G01R 31/006 327/108 |

(Continued)

FOREIGN PATENT DOCUMENTS

| CN | 202332733 U | 7/2012 |
| CN | 103481843 A | 1/2014 |

(Continued)

OTHER PUBLICATIONS

Supplemental European Search Report of EP Application No. 20859082, dated Jan. 28, 2022.

*Primary Examiner* — Jermele M Hollington
*Assistant Examiner* — Suresh K Rajaputra
(74) *Attorney, Agent, or Firm* — Ladas & Parry LLP

(57) ABSTRACT

Embodiments of this application relate to the technical field of electronics, and disclose an electrical control device detection circuit, a detection method, and an electric vehicle. In some embodiments of this application, the detection circuit is configured to detect a drive circuit of the electrical control device. The drive circuit includes a high-side switch unit. The detection circuit includes a first detection module and a control module. A first end of the first detection module is connected to a first end of the electrical control device. A second end of the first detection module is connected to a second end of the electrical control device. A third end of the first detection module is connected to the control module.

19 Claims, 8 Drawing Sheets

(56) References Cited

U.S. PATENT DOCUMENTS

| | | |
|---|---|---|
| 2015/0204930 A1 | 7/2015 | Sykes |
| 2019/0103863 A1 | 4/2019 | Inada et al. |
| 2019/0212722 A1 | 7/2019 | Arensmeier |
| 2022/0107353 A1* | 4/2022 | Du .................. G01R 31/282 |

FOREIGN PATENT DOCUMENTS

| | | |
|---|---|---|
| CN | 104049166 A | 9/2014 |
| CN | 104425184 A | 3/2015 |
| CN | 204666783 U | 9/2015 |
| CN | 105336540 A | 2/2016 |
| CN | 105490255 A | 4/2016 |
| CN | 105742119 A | 7/2016 |
| CN | 106015703 A | 10/2016 |
| CN | 206451660 U | 8/2017 |
| CN | 107305356 A | 10/2017 |
| CN | 207232324 U | 4/2018 |
| CN | 208125885 U | 11/2018 |
| CN | 108958230 A | 12/2018 |
| CN | 109354245 A | 1/2019 |
| CN | 109254245 A | 2/2019 |
| CN | 208522052 U | 2/2019 |
| CN | 109541457 A | 3/2019 |
| CN | 109683109 A | 4/2019 |
| CN | 208867859 U | 5/2019 |
| CN | 209296880 U | 8/2019 |
| EP | 1956494 A2 | 8/2008 |
| JP | 56118153 A | 9/1981 |
| JP | 2004213454 A | 7/2004 |
| JP | 2017130859 A | 7/2017 |
| KR | 101102603 B1 | 1/2012 |
| KR | 20160079507 A | 7/2016 |
| WO | 2019151781 A1 | 8/2019 |

\* cited by examiner

ELECTRICAL CONTROL DEVICE DETECTION CIRCUIT, DETECTION METHOD, AND ELECTRIC VEHICLE

CROSS-REFERENCE TO RELATED APPLICATIONS

This application is a continuation of International Patent Application No. PCT/CN2020/100651, filed on Aug. 22, 2020, which claims priority to Chinese Patent Application No. 201910816907.8, filed on Aug. 30, 2019. The disclosures of the aforementioned patent applications are incorporated herein by reference in their entirety.

TECHNICAL FIELD

Embodiments of this application relate to the technical field of electronics, and in particular, to an electrical control device detection circuit, a detection method, and an electric vehicle.

BACKGROUND

Currently, electric vehicles in place of fuel vehicles have become an evolution trend of the automotive industry. Because intrinsic power of a motor of an electric vehicle is relatively high, a currently available battery pack is basically a high-voltage low-current solution or a low-voltage and high-current solution. However, the voltage of the battery pack, even if relatively low, is still far higher than a safe voltage. Therefore, a controller controls a high-voltage loop indirectly by using a relay. Nevertheless, the relay is a mechanical switch after all, and may face an aging problem after a long time of work. This further leads to circumstances of failure of the relay or a wiring harness connected to the relay. Such circumstances exerts a significant impact on safe operation of the vehicle, and diagnosis of the relay becomes very important.

However, it is found that at least the following problems in the related technology: a fault detection solution for a drive circuit of the relay is currently lacking.

It needs to be noted that the information disclosed in the background technology section above is merely intended for ease of understanding the background of the present disclosure, and therefore, may include information that does not constitute a related technology known to a person of ordinary skill in the art.

SUMMARY

To solve the foregoing technical problem, an embodiment of this application provides an electrical control device detection circuit. The detection circuit is configured to detect a drive circuit of an electrical control device. The drive circuit of the electrical control device includes a drive power module and a high-side switch unit. The drive power module is connected to a first end of the electrical control device by the high-side switch unit. A second end of the electrical control device is grounded. The detection circuit includes a first detection module and a control module. A first end of the first detection module is connected to the first end of the electrical control device. A second end of the first detection module is connected to a second end of the electrical control device. A third end of the first detection module is connected to the control module. The control module is configured to obtain a first electrical signal at the third end of the first detection module; and determine, based on the first electrical signal at the third end of the first detection module, whether a fault occurs in the drive circuit of the electrical control device.

An embodiment of this application further provides an electrical control device detection method. The detection method is applied to a control module in the electrical control device detection circuit mentioned in the foregoing embodiment. The detection method includes: obtaining a first electrical signal at a third end of a first detection module; and determining, based on the first electrical signal at the third end of the first detection module, whether a fault occurs in a drive circuit of the electrical control device.

An embodiment of this application further provides an electric vehicle, including an electrochemical device, an electrical control device, and any detection circuit described above.

In contrast with the prior art, in the embodiments of this application, because electrical conduction status of the drive circuit of the electrical control device in a case of a normal state is different from electrical conduction status of the first detection module in a case of a fault, an electrical signal at the third end of the first detection module differs. Therefore, the control module can determine, based on the electric signal at the third end of the first detection module, whether a fault occurs in the drive circuit of the electrical control device, thereby achieving a purpose of fault detection on the drive circuit of the electrical control device.

In addition, the detection circuit further includes a detection power module, a switch module, and a second detection module. The detection power module is connected to the first end of the electrical control device by the switch module. A first end of the second detection module is connected to the first end of the electrical control device. A second end of the second detection module is connected to the control module. The switch module is connected to the control module.

In addition, the detection power module includes a third power submodule and a voltage divider submodule. The third power submodule is connected to a first end of the voltage divider submodule. A second end of the voltage divider submodule serves as an output end of the detection power module.

In addition, the first detection module includes a first power submodule, a first current-limiting submodule, and a switch element. A first end of the switch element serves as the first end of the first detection module, a second end of the switch element serves as the second end of the first detection module, a third end of the switch element is connected to the first power submodule by the first current-limiting submodule, a fourth end of the switch element is grounded, and the third end of the switch element serves as the third end of the first detection module. Alternatively, a third end of the switch element is connected to the first power submodule, a fourth end of the switch element is connected to a first end of the first current-limiting submodule, a second end of the first current-limiting submodule is grounded, and the first end of the first current-limiting submodule serves as the third end of the first detection module. When a current flows from the first end of the switch element to the second end of the switch element, an electrically conductive path is formed between the third end of the switch element and the fourth end of the switch element.

In addition, the detection circuit further includes a filter module. The third end of the first detection module is connected to the control module by the filter module. In this implementation, high stability of a detection signal at the third end of the first detection module is ensured.

In addition, the first detection module includes: a first power submodule, a filter submodule, a first current-limiting submodule, and a switch element. A first end of the switch element serves as the first end of the first detection module. A second end of the switch element serves as the second end of the first detection module. A third end of the switch element is connected to the first power submodule by the first current-limiting submodule. A fourth end of the switch element is connected to a first end of the filter submodule. A second end of the filter submodule is grounded. A third end of the filter submodule serves as the third end of the first detection module.

In addition, the detection circuit further includes a first current-limiting module. The first end of the first detection module is connected to the first end of the electrical control device by the first current-limiting module. This implementation avoids a fault of the drive circuit or the detection circuit caused by an excessive current that is output after the current flows through the detection power module.

In addition, the second detection module includes a second power submodule, a second current-limiting submodule, and a switch transistor. The second power submodule is connected to a first end of the switch transistor by the second current-limiting submodule. A second end of the switch transistor is grounded. A control end of the switch transistor serves as the first end of the second detection module. The first end of the switch transistor serves as the second end of the second detection module. This implementation avoids such problems as damage to the control module caused by excessive strength of the first electrical signal.

In addition, the detection circuit further includes a second current-limiting module. A second end of the second detection module is connected to the control module by the second current-limiting module.

In addition, the detection circuit further includes a freewheeling module. The freewheeling module is parallel-connected to the electrical control device. This implementation can avoid a circumstance that an induced electromotive force generated by the electrical control device burns out a device in the circuit.

In addition, the detection circuit further includes a third detection module. A first end of the third detection module is connected to the first end of the high-side switch unit. A second end of the third detection module is connected to the control module. The control module is further configured to determine, based on an electrical signal at the second end of the third detection module, whether a fault occurs in the drive power module. In this implementation, the drive power module can be detected when the electrical control device is not enabled.

In addition, the control module includes a processing submodule and a first multiplexer submodule. The processing submodule is connected to the third end of the first detection module and the second end of the second detection module by the first multiplexer submodule. In this implementation, a "one-to-many" detection function of a processor port is implemented.

In addition, the control module includes a processing submodule and a second multiplexer submodule. The processing submodule is connected to the high-side switch unit of the electrical control device by the second multiplexer submodule. In this implementation, a "one-to-many" control function of the processor port is implemented.

In addition, the obtaining a first electrical signal at the third end of the first detection module and determining, based on the first electrical signal at the third end of the first detection module, whether a fault occurs in the drive circuit of the electrical control device specifically include: (i) obtaining the first electrical signal at the third end of the first detection module in a state in which a high-side switch unit is not enabled and a switch module is turned off; determining whether a level of the first electrical signal is a preset first level; determining, if a determining result is that the level of the first electrical signal is the preset first level, that a shorted-to-power-supply fault occurs in the drive circuit; or determining, if a determining result is that the level of the first electrical signal is not the preset first level, that no shorted-to-power-supply fault occurs in the drive circuit; or, (ii) obtaining the first electrical signal at the third end of the first detection module in a case in which a high-side switch unit is closed or a switch module is closed; determining whether a level of the first electrical signal at the third end of the first detection module is a preset first level; determining, if it is determined that the level of the first electrical signal at the third end of the first detection module is the preset first level, that no shorted-to-ground fault occurs in the drive circuit; or determining, if it is determined that the level of the first electrical signal at the third end of the first detection module is not the preset first level, that a shorted-to-ground fault occurs in the drive circuit.

In addition, the obtaining a first electrical signal at the third end of the first detection module and determining, based on the first electrical signal at the third end of the first detection module, whether a fault occurs in the drive circuit of the electrical control device specifically include: obtaining the first electrical signal at the third end of the first detection module and a second electrical signal at a second end of a second detection module in a state in which a high-side switch unit is not enabled and a switch module is turned off; determining whether a level of the first electrical signal and a level of the second electrical signal meet a first preset condition, where the first preset condition is that the level of the first electrical signal is a preset first level, and, the level of the second electrical signal is a preset second level; and determining, if a determining result is that the level of the first electrical signal and the level of the second electrical signal meet the first preset condition, that a shorted-to-power-supply fault occurs in the drive circuit; or determining, if a determining result is that the level of the first electrical signal or the level of the second electrical signal does not meet the first preset condition, that no shorted-to-power-supply fault occurs in the drive circuit.

In addition, after it is determined that no shorted-to-power-supply fault occurs in the drive circuit, the electrical control device detection method further includes: obtaining a third electrical signal at the third end of the first detection module and a fourth electrical signal at the second end of the second detection module in a state in which the switch module is closed; determining whether a level of the third electrical signal and a level of the fourth electrical signal meet a second preset condition, where the second preset condition is that the level of the third electrical signal is not the first level, and, the level of the fourth electrical signal is not the second level; and determining, if a determining result is that the level of the third electrical signal and the level of the fourth electrical signal meet the second preset condition, that a shorted-to-ground fault occurs in the drive circuit.

In addition, the obtaining a first electrical signal at the third end of the first detection module and determining, based on the first electrical signal at the third end of the first detection module, whether a fault occurs in the drive circuit of the electrical control device specifically include: monitoring a fifth electrical signal at the third end of the first detection module and a sixth electrical signal at a second end of a second detection module in real time in a state in which a high-side switch is enabled and a switch module is turned off; and determining, if it is determined that a level of the fifth electrical signal is not a first level and a level of the sixth electrical signal is not a second level, that an open-circuit fault occurs in a high-side switch unit of the drive circuit or a shorted-to-ground fault occurs in the drive circuit; or determining, if it is determined that a level of the fifth electrical signal is not a first level but a level of the sixth electrical signal is a second level, that a ground loop loss fault occurs in the drive circuit.

BRIEF DESCRIPTION OF DRAWINGS

One or more embodiments are described exemplarily with reference to accompanying drawings corresponding to the embodiments. The exemplary description does not constitute any limitation on the embodiments. Components marked with the same reference numeral in the accompanying drawings represent similar components.

Unless otherwise specified, the accompanying drawings do not constitute any scale limitation.

DETAILED DESCRIPTION OF EMBODIMENTS

Figure 1:
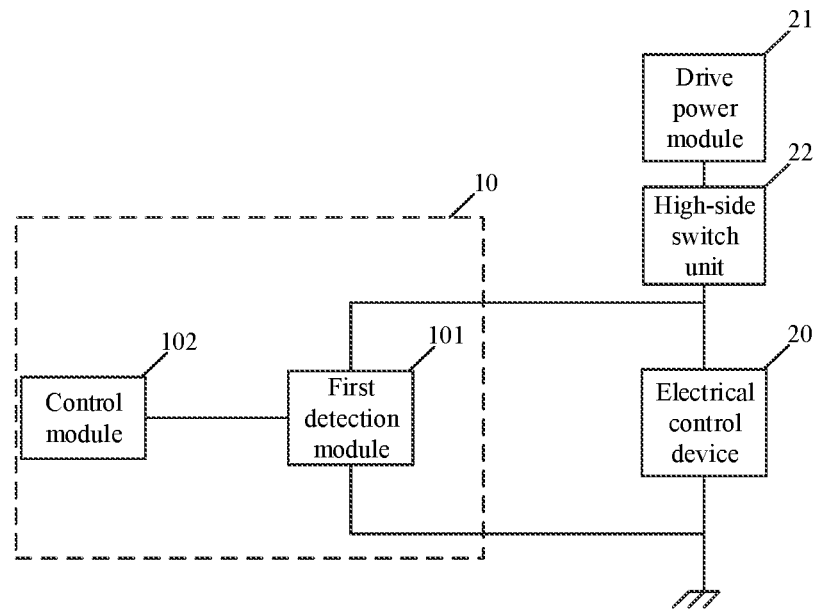
FIG. 1 is a schematic structural diagram of an electrical control device detection circuit according to a first embodiment of this application.

To make the objectives, technical solutions, and advantages of this application clearer, the following describes the embodiments of this application in detail with reference to accompanying drawings. A person of ordinary skill in the art understands that in each embodiment of this application, many technical details are provided to make readers better understand this application. However, the technical solutions claimed in this application can still be implemented based on variations and modifications of the following embodiments even without the technical details.

The reference numerals assigned to the components herein, such as "first" and "second", are merely used to distinguish the described objects but without indicating any sequential or technical meaning. Unless otherwise specified, "connection" and "concatenation" mentioned in this application include direct and indirect connections (concatenations).

A first embodiment of this application relates to a detection circuit 10 of an electrical control device. The detection circuit 10 is configured to detect a drive circuit of the electrical control device 20. The drive circuit of the electrical control device 20 includes a drive power module 21 and a high-side switch unit 22. The drive power module 21 is connected to a first end of the high-side switch unit 22. A second end of the high-side switch unit 22 is connected to a first end of the electrical control device 20. A second end of the electrical control device 20 is grounded. As shown in FIG. 1, the detection circuit 10 includes a first detection module 101 and a control module 102. A first end of the first detection module 101 is connected to a first end of the electrical control device 20. A second end of the first detection module 101 is connected to a second end of the electrical control device 20. A third end of the first detection module 101 is connected to the control module 102. The control module 102 is configured to obtain a first electrical signal at the third end of the first detection module 101; and determine, based on the first electrical signal at the third end of the first detection module 101, whether a fault occurs in the drive circuit of the electrical control device 20. When a current flows between the first end of the first detection module 101 and the second end of the first detection module 101, a level of an electrical signal at the third end of the first detection module is a preset first level. When no current flows between the first end of the first detection module 101 and the second end of the first detection module 101, the level of the electrical signal at the third end of the first detection module is a reverse level of the preset first level.

It needs to be noted that, a person skilled in the art understands that the first level may be a high level or a low level. In practical applications, the first level may be determined based on a specific circuit structure of the first detection module.

It needs to be noted that in this embodiment, a connection relationship between the switch module 104 and the control module 102 is not shown in the drawing. However, this does not mean that there is no connection between the control module 102 and the switch module 104. The control module 102 may be connected to the switch module 104 in a wired or wireless manner.

It needs to be noted that, because electrical conduction status of the drive circuit of the electrical control device in a case of a normal state is different from electrical conduction status of the first detection module in a case of a fault, the electrical signal at the third end of the first detection module differs. Therefore, the control module can determine, based on the electric signal at the third end of the first detection module, whether a fault occurs in the drive circuit of the electrical control device, thereby achieving a purpose of fault detection on the drive circuit of the electrical control device.

It needs to be noted that the electrical control device may be a relay or another device that uses a low current to control its status. This embodiment does not limit the specific type of the electrical control device.

It needs to be noted that the foregoing description is merely exemplary, but does not constitute any limitation on the technical solutions of this application.

In contrast with the prior art, in the electrical control device detection circuit provided in this embodiment, because electrical conduction status of the drive circuit of the electrical control device in a case of a normal state is different from electrical conduction status of the first detection module in a case of a fault, the electrical signal at the third end of the first detection module differs. Therefore, the control module can determine, based on the electric signal at the third end of the first detection module, whether a fault occurs in the drive circuit of the electrical control device, thereby achieving a purpose of fault detection on the drive circuit of the electrical control device.

A second embodiment of this application relates to an electrical control device detection circuit. This embodiment is a further improvement of the first embodiment. The specific improvement is: a detection power module, a switch module, and a second detection module are added.

Figure 2:
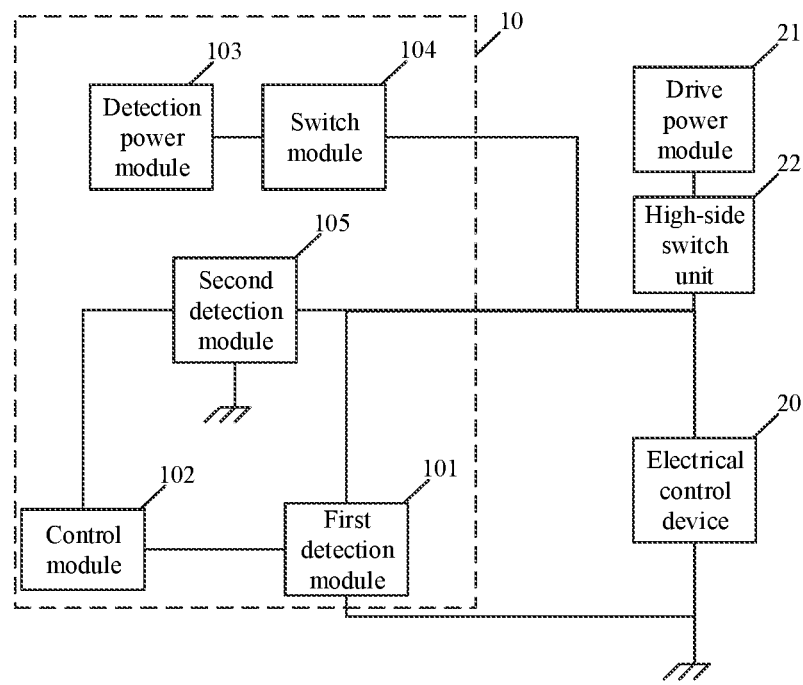
FIG. 2 is a schematic structural diagram of an electrical control device detection circuit according to a second embodiment of this application.

Specifically, as shown in FIG. 2, the detection circuit includes: a first detection module 101, a control module 102, a detection power module 103, a switch module 104, and a second detection module 105. A first end of the first detection module 101 is connected to the first end of the electrical control device 20. A second end of the first detection module 101 is connected to the second end of the electrical control device 20. A third end of the first detection module 101 is connected to the control module 102. The detection power module 103 is connected to the first end of the electrical control device 20 by the switch module 104. A first end of the second detection module 105 is connected to the first end of the electrical control device 20. A second end of the second detection module 105 is connected to the control module 102. The switch module 104 is connected to the control module 102. When the first end of the second detection module 105 is connected to a high level, a level at the second end of the second detection module 105 is a preset second level. When the first end of the second detection module 105 is connected to a low level, the level at the second end of the second detection module 105 is a reverse level of the second level.

In an example, a current output by the detection power module 103 is less than an operating current of the electrical control device 20. The operating current means a minimum current that causes the electrical control device to operate. The current output by the detection power module 103 is less than the operating current of the electrical control device. Therefore, when the switch module 104 is closed and the high-side switch unit 22 is not enabled, the electrical control device 20 is still in a disabled state. After the switch module 104 is closed, if no shorted-to-ground fault occurs in the drive circuit, the current output by the detection power module 103 passes through the first detection module 101. If a shorted-to-ground fault occurs in the drive circuit, an impedance of the detection power module 103 to the ground is close to 0, and therefore, the current output by the detection power module 103 will not pass through the first detection module 101. Therefore, the electrical signal at the third end of the first detection module 101 differs between occurrence of a shorted-to-ground fault in the drive circuit and no occurrence of a shorted-to-ground fault. The control module 102 can determine, based on the electrical signal at the third end of the first detection module 101, whether a shorted-to-ground fault occurs in the drive circuit.

In an example, the control module 102: (i) in a state in which a high-side switch unit is not enabled and a switch module is turned off, obtains the first electrical signal at the third end of the first detection module and a second electrical signal at a second end of a second detection module; determines whether a level of the first electrical signal and a level of the second electrical signal meet a first preset condition, where the first preset condition is that the level of the first electrical signal is a preset first level, and, the level of the second electrical signal is a preset second level; and determines, if a determining result is that the level of the first electrical signal and the level of the second electrical signal meet the first preset condition, that a shorted-to-power-supply fault occurs in the drive circuit; or determines, if a determining result is that the level of the first electrical signal or the level of the second electrical signal does not meet the first preset condition, that no shorted-to-power-supply fault occurs in the drive circuit; and (ii) in a state in which the switch module is closed, obtains a third electrical signal at the third end of the first detection module and a fourth electrical signal at the second end of the second detection module; determines whether a level of the third electrical signal and a level of the fourth electrical signal meet a second preset condition, where the second preset condition is that the level of the third electrical signal is not the first level, and, the level of the fourth electrical signal is not the second level; and determines, if a determining result is that the level of the third electrical signal and the level of the fourth electrical signal meet the second preset condition, that a shorted-to-ground fault occurs in the drive circuit.

In contrast with the prior art, in the electrical control device detection circuit provided in this embodiment, because electrical conduction status of the drive circuit of the electrical control device in a case of a normal state is different from electrical conduction status of the first detection module and the second detection module in a case of a fault, the control module can determine the type of the fault in the drive circuit of the electrical control device based on the electric signal at the third end of the first detection module and the electric signal at the second end of the second detection module, thereby achieving a purpose of fault detection on the drive circuit of the electrical control device and a purpose of determining the fault type.

A third embodiment of this application relates to an electrical control device detection circuit. The third embodiment exemplifies the circuit structure of the first detection module 101 mentioned in the first embodiment and the second embodiment. The content that has been described in the first embodiment will be omitted here.

Figure 3:
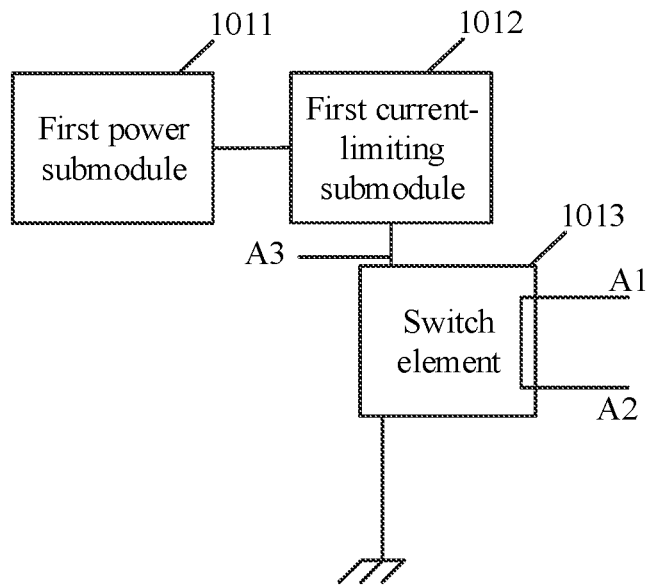
FIG. 3 is a schematic structural diagram of a first detection module according to a third embodiment of this application.

Specifically, as shown in FIG. 3, in this embodiment, the first detection module 101 includes a first power submodule 1011, a first current-limiting submodule 1012, and a switch element 1013. A first end of the switch element 1013 serves as the first end A1 of the first detection module 101. A second end of the switch element 1013 serves as the second end A2 of the first detection module 101. A third end of the switch element 1013 is connected to the first power submodule 1011 by the first current-limiting submodule 1012. A fourth end of the switch element 1013 is grounded. The third end of the switch element 1013 serves as the third end A3 of the first detection module 101. When a current flows from the first end of the switch element 1013 to the second end of the switch element 1013, an electrically conductive path is formed between the third end of the switch element 1013 and the fourth end of the switch element 1013. The first current-limiting submodule 1012 may include one or more resistors. The first level is a low level.

The first current-limiting submodule added in the detection circuit can avoid damage to a device in the first detection module caused by an excessive current flowing through the first detection module.

It needs to be noted that FIG. 3 exemplifies the structure of the first detection module 101 by giving an example in which the first current-limiting submodule 1012 is serial-connected between the third end of the switch element 1013 and the first power submodule 1011. In practical applications, another connection relationship between the first current-limiting submodule 1012, the first power submodule 1011, and the switch element 1013 may be: the third end of the switch element 1013 is connected to the first power submodule 1011, and the fourth end of the switch element 1013 is connected to the first end of the first current-limiting submodule 1012, the second end of the first current-limiting submodule is grounded, and the first end of the first current-limiting submodule serves as the third end A3 of the first detection module. The first level is a high level. This embodiment does not limit the connection relationship between the first current-limiting submodule 1012, the first power submodule 1011, and the switch element 1013.

In an example, the detection circuit further includes a filter module. The third end of the first detection module 101 is connected to the control module 102 by the filter module. For example, the third end of the first detection module 101 is connected to a first end of the filter module, a second end of the filter module is grounded, and a third end of the filter module is connected to the control module.

It needs to be noted that, by being connected to the control module through the filter module, the third end of the first detection module can ensure high stability of a detection signal at the third end of the first detection module.

In an example, the filter module includes a capacitor. A first end of the capacitor serves as the first end and the third end of the filter module, and a second end of the capacitor serves as the second end of the filter module.

It needs to be noted that, a person skilled in the art understands that the filter module may adopt another circuit structure. For example, a first-order resistor-capacitor (RC) filter circuit structure may be selected. This embodiment does not limit the specific circuit structure of the filter module.

Specifically, after the switch module is closed, if no shorted-to-ground fault occurs in the drive circuit, the current output from the detection power module 103 flows through the first end of the switch element 1013 to the second end of the switch element 1013, and an electrically conductive path is formed between the third end of the switch element 1013 and the fourth end of the switch element 1013. Therefore, the level of the electrical signal at the fourth end of the switch element 1013 is the preset first level. When a shorted-to-ground fault occurs in the drive circuit, an output end of the detection power module 103 is equivalent to connecting to the ground, and no current flows between the first end of the switch element 1013 and the second end of the switch element 1013, and no electrically conductive path can be formed between the third end of the switch element 1013 and the fourth end of the switch element 1013. Therefore, the level of the electrical signal at the fourth end of the switch element 1013 is not the preset first level. Therefore, the control module 102 can determine, based on the electrical signal at the fourth end of the switch element 1013, whether a shorted-to-ground fault occurs in the drive circuit.

In an example, the switch element is any one of a photocoupler, a relay, a reed switch, and an optical field effect transistor.

In an example, the detection circuit further includes a first current-limiting module. The first end of the first detection module is connected to a node between the second end of the first switch module and the first end of the electrical control device by the first current-limiting module.

It needs to be noted that the first current-limiting module added in the first detection module can avoid problems such as damage to the control module caused by excessive strength of the electrical signal output by the fourth end of the switch element.

Figure 4:
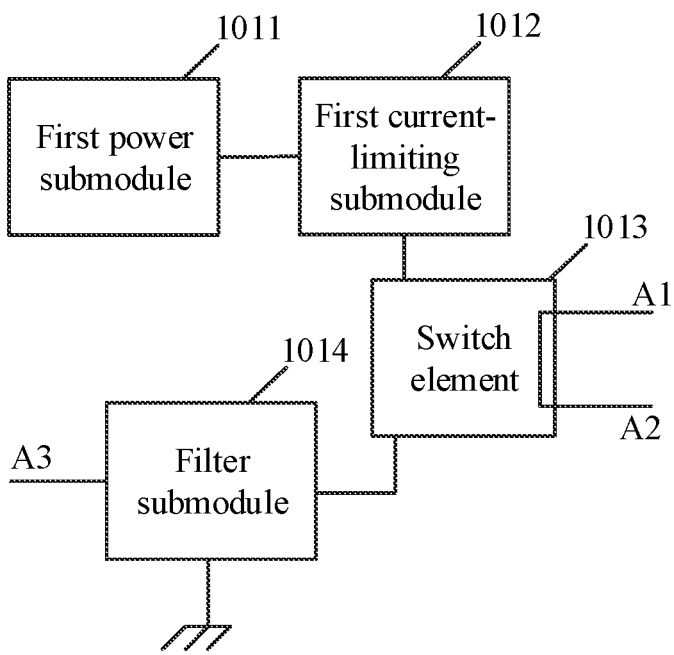
FIG. 4 is another schematic structural diagram of a first detection module according to a third embodiment of this application.

It needs to be noted that, a person skilled in the art understands that in practical applications, the first detection module 101 may adopt another form of structure. For example, as shown in FIG. 4, the first detection module 101 includes: a first power submodule 1011, a filter submodule 1014, a first current-limiting submodule 1012, and a switch element 1013. A first end of the switch element 1013 serves as the first end A1 of the first detection module 101. A second end of the switch element 1013 serves as the second end A2 of the first detection module 101. A third end of the switch element 1013 is connected to the first power submodule 1011 by the first current-limiting submodule 1012. A fourth end of the switch element 1013 is connected to a first end of the filter submodule 1014. A second end of the filter submodule 1014 is grounded. A third end of the filter submodule 1014 serves as the third end A3 of the first detection module. The first level is a high level. The filter submodule 1014 may be a capacitor. A first end of the capacitor serves as the first end and the third end of the filter submodule, and a second end of the capacitor serves as the second end of the filter submodule. The filter submodule 1014 may adopt an RC filter structure or the like.

In contrast with the prior art, in the electrical control device detection circuit provided in this embodiment, because connection status between the third end of the switch element and the fourth end of the switch element differs between occurrence of an open-circuit fault and occurrence of a shorted-to-ground fault in the drive circuit, the electrical signal at the third end of the first detection module differs. Therefore, the control module can determine the fault type based on the electrical signal at the third end of the first detection module.

A fourth embodiment of this application relates to an electrical control device detection circuit. This embodiment exemplifies the circuit structure of the second detection module 105 mentioned in the second embodiment. The content that has been described in the second embodiment will be omitted here.

Figure 5:
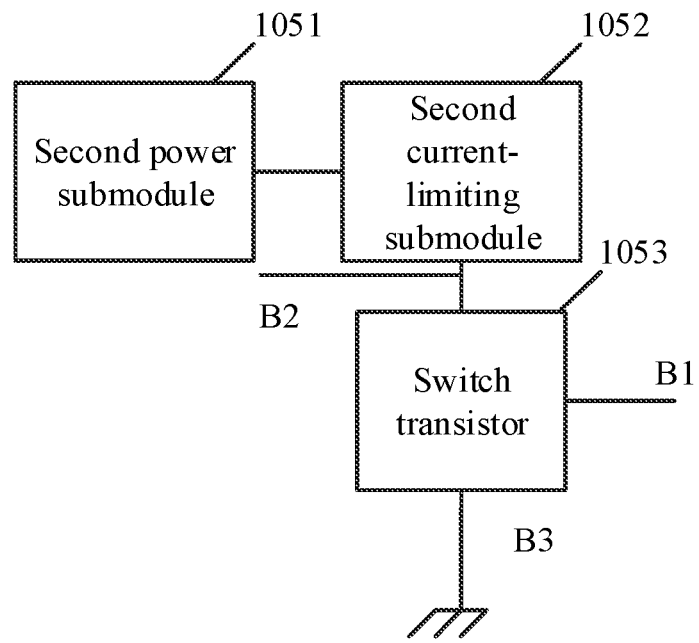
FIG. 5 is a schematic structural diagram of a second detection module according to a fourth embodiment of this application.

Specifically, as shown in FIG. 5, in this embodiment, the second detection module 105 includes a second power submodule 1051, a second current-limiting submodule 1052, and a switch transistor 1053. The second power submodule 1051 is connected to a first end of the switch transistor 1053 by the second current-limiting submodule 1052. A control end of the switch transistor 1053 serves as a first end B1 of the second detection module. The first end of the switch transistor 1053 serves as a second end B2 of the second detection module. A second end of the switch transistor 1053 serves as a third end B3 of the second detection module.

Specifically, because status of the switch transistor 1053 changes depending on a voltage value of an electrical signal input into the control end of the switch transistor 1053, when electrical conduction is actuated between the first end and the second end of the switch transistor 1053, the first end of the switch transistor 1053 exhibits a low-level signal. When electrical conduction is not actuated between the first end and the second end of the switch transistor 1053, the first end of the switch transistor 1053 exhibits a high-level signal. Because the electrical signal received at the control end of the switch transistor 1053 differs between a normal state of the drive circuit of the electrical control device 20 and a faulty state of the drive circuit of the electrical control device 20, the electrical signal at the first end of the switch transistor 1053 differs.

It is assumed that the switch transistor is an N-type transistor and the preset second level is a low level. After the switch module 104 is closed, if the first end of the switch transistor exhibits a low-level signal, it means that the switch transistor is closed, that is, the drive circuit of the electrical control device is normal. If the first end of the switch transistor exhibits a high-level signal, it means that the switch transistor is not closed, that is, the drive circuit of the electrical control device is faulty, and the fault type needs to be further determined based on a detection result of the first detection module.

It needs to be noted that, a person skilled in the art understands that the second level may be a high level or a low level. In practical applications, the second level may be determined based on the device type and circuit structure selected for each module in the detection circuit.

In an example, the detection circuit further includes a second current-limiting module. The second end B2 of the second detection module 105 is connected to the control module 102 by the second current-limiting module.

It needs to be noted that the second current-limiting module added in the detection circuit can avoid problems such as damage to the control module caused by excessive strength of the first electrical signal.

In contrast with the prior art, in the electrical control device detection circuit provided in this embodiment, because the electrical signal at the control end of the switch transistor differs between occurrence of a fault in the drive circuit and no occurrence of a fault in the drive circuit, the status of the switch transistor differs. Consequently, the electrical signal at the first end of the switch transistor differs. Therefore, the control module can determine, based on the electrical signal at the first end of the switch transistor, whether a fault occurs in the drive circuit.

A fifth embodiment of this application relates to an electrical control device detection circuit. This embodiment exemplifies the circuit structure of the detection power module 103 mentioned in the second embodiment. The content that has been described in the second embodiment will be omitted here.

Figure 6:
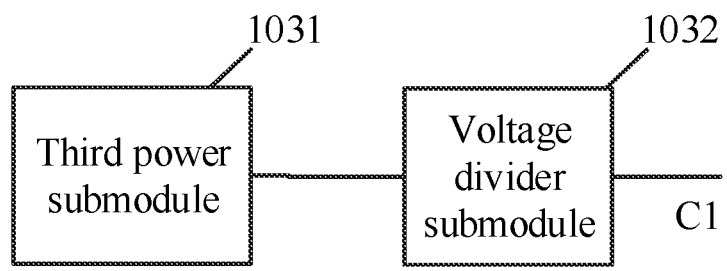
FIG. 6 is a schematic structural diagram of a detection power module according to a fifth embodiment of this application.

Specifically, as shown in FIG. 6, in this embodiment, the detection power module 103 includes a third power submodule 1031 and a voltage divider submodule 1032. The third power submodule 1031 is connected to a first end of the voltage divider submodule 1032. A second end of the voltage divider submodule 1032 serves as an output end Cl of the detection power module 103.

In an example, the voltage divider submodule 1032 includes one or more resistors.

It needs to be noted that, a person skilled in the art understands that an impedance value of the voltage divider submodule 1032 may be determined based on the voltage output by the third power submodule 1031 and an operating current of the electrical control device. This is not limited herein.

Figure 7:
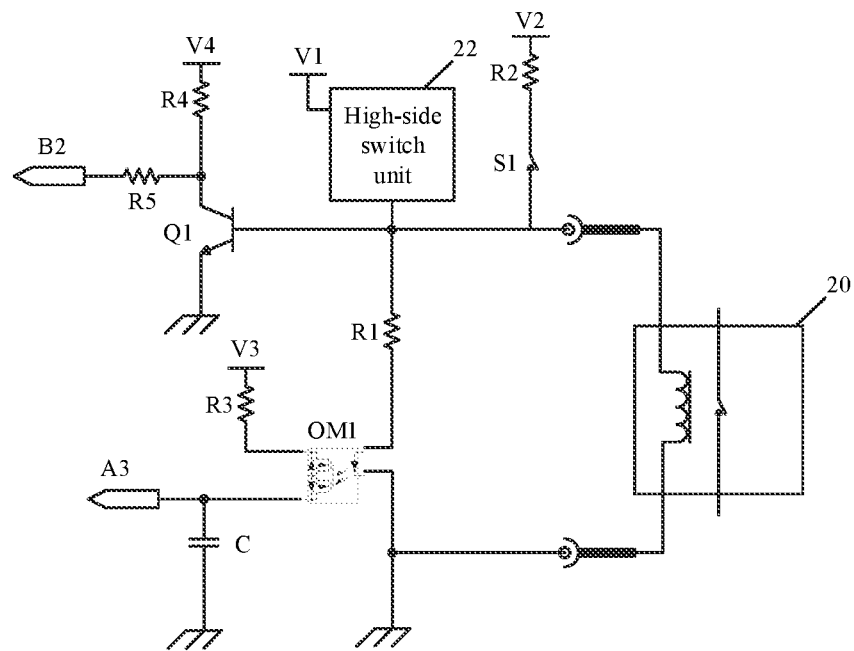
FIG. 7 is a circuit diagram of a drive circuit and a detection circuit of an electrical control device according to a fifth embodiment of this application.

In an example, the electrical control device 20 is a relay, the first detection module adopts a structure shown in FIG. 4, the second detection module adopts a structure enumerated in the third embodiment, the detection power module adopts a structure enumerated in the fourth embodiment, and circuit diagrams of the drive circuit and the detection circuit of the electrical control device are shown in FIG. 7. In FIG. 7, V1 represents a drive power module of the drive circuit, V2 represents a third power submodule in the detection power module 103, R2 represents a voltage divider submodule, S1 represents a switch module, R1 represents a first current-limiting module, V3 represents a first power submodule, R3 represents a first current-limiting submodule, OW represents a switch element, C represents a filter submodule, A3 represents a third end of the first detection module, V4 represents a second power submodule, R4 represents a second current-limiting submodule, B2 represents a second end of the second detection module, R5 represents a second current-limiting module, and Q1 represents a switch transistor. The first level is a high level, and the second level is a low level.

In contrast with the prior art, in the electrical control device detection circuit provided in this embodiment, a voltage divider submodule is serial-connected in the detection power module, and the current output by the detection power module is less than the operating current of the electrical control device. In this way, the detection circuit can implement the fault detection on the drive circuit of the electrical control device in the state in which the electrical control device is not enabled.

A sixth embodiment of this application relates to an electrical control device detection circuit. This embodiment is a further improvement of the second embodiment. The specific improvement is: a freewheeling module 106 is added in the detection circuit. The content that has been described in the second embodiment will be omitted here.

Figure 8:
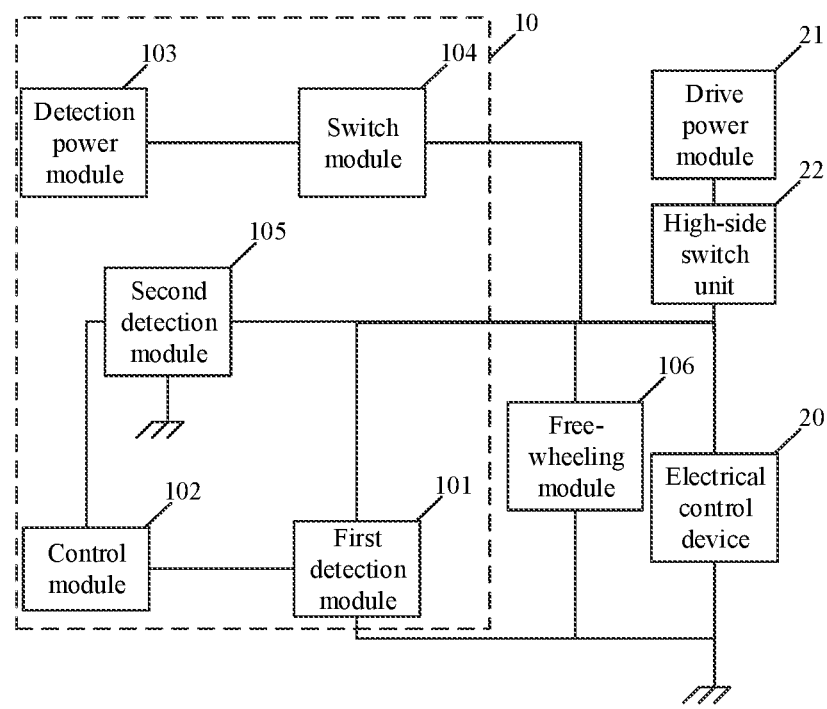
FIG. 8 is a schematic structural diagram of an electrical control device detection circuit according to a sixth embodiment of this application.

Specifically, as shown in FIG. 8, the freewheeling module 106 is parallel-connected to the electrical control device 20.

Figure 9:
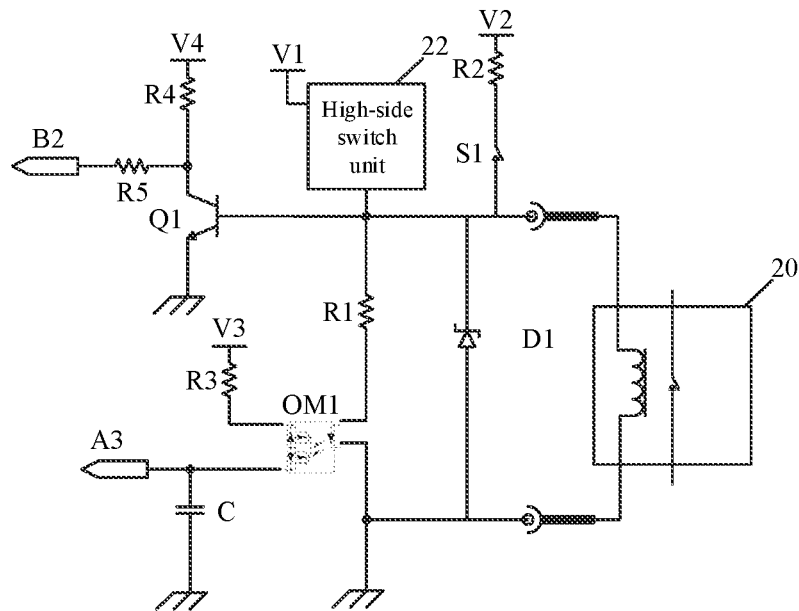
FIG. 9 is a circuit diagram of a drive circuit and a detection circuit of an electrical control device according to a sixth embodiment of this application.

In an example, the freewheeling module 106 is a transient voltage suppression diode, and the circuit diagrams of the drive circuit and the detection circuit of the electrical control device are shown in FIG. 9. In FIG. 9, D1 represents a transient voltage suppression diode, V1 represents a drive power of the drive circuit, V2 represents a third power submodule in the detection power module 103, R2 represents a voltage divider submodule, S1 represents a switch module, R1 represents a first current-limiting module, V3 represents a first power submodule, R3 represents a first current-limiting submodule, OW represents a switch element, C represents a filter submodule, A3 represents a third end of the first detection module, V4 represents a second power submodule, R4 represents a second current-limiting submodule, B2 represents a second end of the second detection module, R5 represents a second current-limiting module, and Q1 represents a switch transistor.

In contrast with the prior art, in the electrical control device detection circuit provided in this embodiment, the freewheeling module is parallel-connected to the electrical control device. When the current flowing in the electrical control device disappears, an induced electromotive force generated by the electrical control device is consumed by work done in a loop formed by the freewheeling module and the electrical control device, thereby protecting safety of other devices in the circuit.

A seventh embodiment of this application relates to an electrical control device detection circuit. This embodiment is a further improvement of the second embodiment. The specific improvement is: a third detection module is added in the detection circuit. The content that has been described in the first embodiment will be omitted here.

Figure 10:
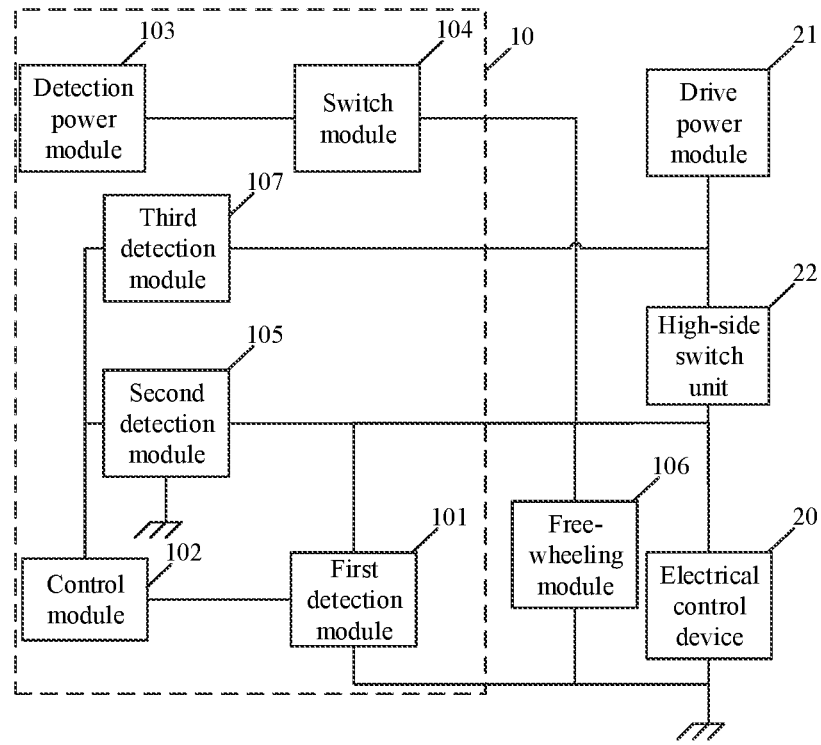
FIG. 10 is a schematic structural diagram of an electrical control device detection circuit according to a seventh embodiment of this application.

Specifically, as shown in FIG. 10, a first end of the third detection module 107 is connected to the first end of the high-side switch unit 22. A second end of the third detection module 107 is connected to the control module 102. The control module 102 is further configured to determine, based on a fourth electrical signal at the second end of the third detection module 107, whether a fault occurs in the drive power module 21.

Specifically, if a fault occurs in the drive power module 21, no electrical signal exists at a node between the drive power module 21 and the high-side switch unit 22. Therefore, the third detection module 107 may detect the node between the drive power module 21 and the high-side switch unit 22 to determine whether a fault occurs in the drive power module 21.

Figure 11:
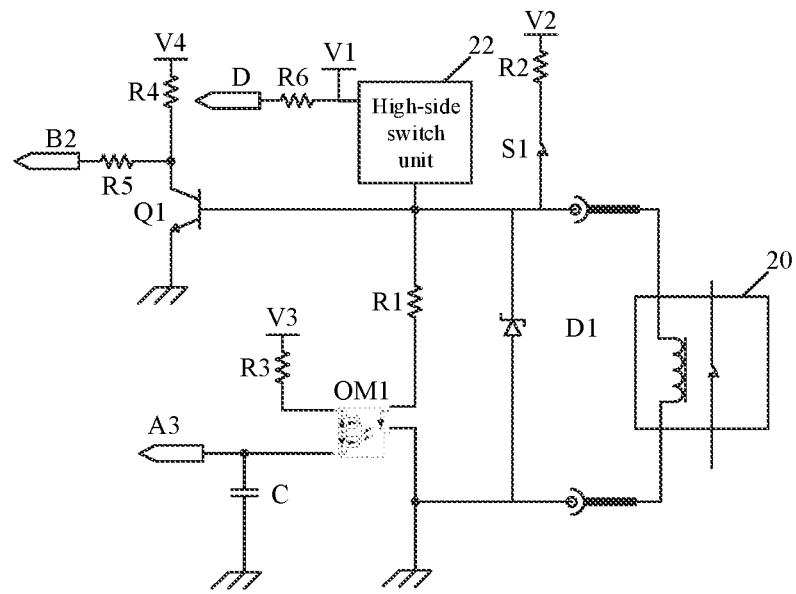
FIG. 11 is a circuit diagram of a drive circuit and a detection circuit of an electrical control device according to a seventh embodiment of this application.

In an example, the third detection module 107 includes resistors. FIG. 11 shows a circuit diagram of a drive circuit and a detection circuit of an electrical control device. In FIG. 11, R6 represents a third detection module, D represents a second end of the third detection module, D1 represents a transient voltage suppression diode, V1 represents a drive power of the drive circuit, V2 represents a third power submodule in the detection power module 103, R2 represents a voltage divider submodule, S1 represents a switch module 104, R1 represents a first current-limiting module, V3 represents a first power submodule, R3 represents a first current-limiting submodule, OM1 represents a switch element, C represents a filter submodule, A3 represents a third end of the first detection module, V4 represents a second power submodule, R4 represents a second current-limiting submodule, B2 represents a second end of the second detection module, R5 represents a second current-limiting module, and Q1 represents a switch transistor.

It needs to be noted that, a person skilled in the art understands that FIG. 11 is merely exemplary. In practical applications, each module may adopt another circuit structure that serves a similar function. This embodiment does not limit the form of the specific circuit structure of each module.

In contrast with the prior art, the electrical control device detection circuit provided in this embodiment can determine, based on the electrical signal at the second end of the third detection module when the electrical control device is not enabled, whether the drive power in the drive circuit is faulty, thereby further improving the fault detection on the drive circuit of the electrical control device.

An eighth embodiment of this application relates to an electrical control device detection circuit. This embodiment exemplifies the structure of the control module mentioned in the second embodiment.

Figure 12:
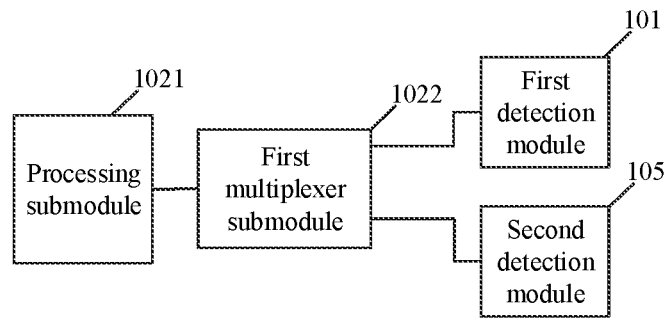
FIG. 12 is a schematic structural diagram of an electrical control device detection circuit according to an eighth embodiment of this application.

Specifically, as shown in FIG. 12, the control module 102 includes a processing submodule 1021 and a first multiplexer submodule 1022. The processing submodule 1021 is connected to the third end of the first detection module 101 and the second end of the second detection module 105 by the first multiplexer submodule 1022.

In an example, the first multiplexer submodule 1022 includes a plurality of multiplexers. For example, the first multiplexer submodule 1022 includes a first multiplexer and a second multiplexer. The processing submodule 1021 is connected to the third end of the first detection module 101 by the first multiplexer. The processing submodule 1021 is connected to the second end of the second detection module 105 by the second multiplexer.

It needs to be noted that the processing submodule 1021 is connected to the first detection module 101 and the second detection module 105 by the multiplexer submodule to implement a "one-to-many" detection function of a processor port, thereby reducing the required quantity of ports of the processing submodule. In this way, one processing submodule can be connected to more first detection modules 101 and second detection modules 105.

A ninth embodiment of this application relates to an electrical control device detection circuit. This embodiment exemplifies the structure of the control module mentioned in the first embodiment.

Figure 13:
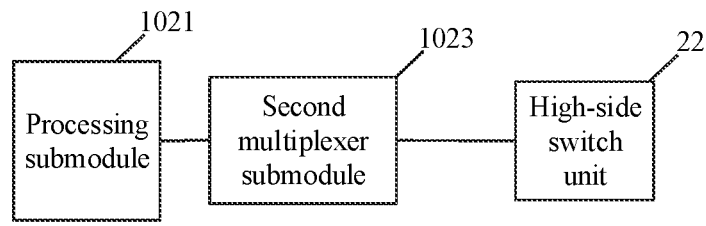
FIG. 13 is a schematic connection diagram of a control module and a high-side switch unit according to a ninth embodiment of this application.

Specifically, as shown in FIG. 13, the control module 102 includes a processing submodule 1021 and a second multiplexer submodule 1023. The processing submodule 1021 is connected to the high-side switch unit 22 by the second multiplexer submodule 1023.

Optionally, the processing submodule 1021 is connected to the switch module 104 by a third multiplexer submodule.

It needs to be noted that the processing submodule is connected to the high-side switch unit in a "one-to-many" connection mode, thereby further reducing the required quantity of ports of the processing submodule.

Figure 14:
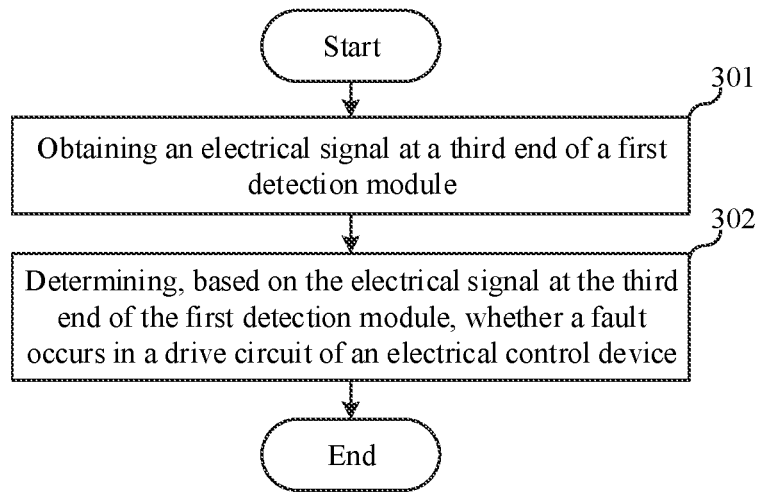
FIG. 14 is a flowchart of an electrical control device detection method according to a tenth embodiment of this application.

A tenth embodiment of this application relates to an electrical control device detection method, applied to the control module in the electrical control device detection circuit according to any of the first to ninth embodiments. As shown in FIG. 14, the electrical control device detection method includes the following steps.

When the high-side switch unit in the drive circuit of the electrical control device is not enabled, the following steps are performed:

Step 301: obtaining a first electrical signal at a third end of a first detection module.

Step 302: determining, based on the first electrical signal at the third end of the first detection module, whether a fault occurs in a drive circuit of an electrical control device.

Specifically, because electrical conduction status of the drive circuit of the electrical control device in a case of a normal state is different from electrical conduction status of the first detection module in a case of a fault, the electrical signal at the third end of the first detection module differs. Therefore, the control module can determine, based on the electric signal at the third end of the first detection module, whether a fault occurs in the drive circuit of the electrical control device, thereby achieving a purpose of fault detection on the drive circuit of the electrical control device.

In an example, the control module obtains the first electrical signal at the third end of the first detection module in a case in which a high-side switch unit is closed or a switch module is closed; determines whether a level of the first electrical signal at the third end of the first detection module is a preset first level; determines, if it is determined that the level of the first electrical signal at the third end of the first detection module is the preset first level, that no shorted-to-ground fault occurs in the drive circuit; or determines, if it is determined that the level of the first electrical signal at the third end of the first detection module is not the preset first level, that a shorted-to-ground fault occurs in the drive circuit. The first level may be a high level or a low level, and specific setting thereof depends on the structure of the first detection module. When the first detection module adopts the structure shown in FIG. 3, the first level signal is a low-level signal. When the first detection module adopts the structure shown in FIG. 4, the first level signal is a high-level signal.

In an example, the control module obtains the first electrical signal at the third end of the first detection module in a case in which both a high-side switch unit and a switch module are turned off; determines whether a level of the first electrical signal at the third end of the first detection module is a preset first level; determines, if it is determined that the level of the first electrical signal at the third end of the first detection module is the preset first level, that a shorted-to-power-supply fault occurs in the drive circuit; or determines, if it is determined that the level of the first electrical signal at the third end of the first detection module is not the preset first level, that no shorted-to-power-supply fault occurs in the drive circuit.

Apparently, this embodiment is a method embodiment corresponding the first to ninth embodiments, and this embodiment may be implemented in coordination with the first to ninth embodiments. Relevant technical details mentioned in the first to ninth embodiments are still applicable to this embodiment. For brevity, the details are omitted here. Correspondingly, the relevant technical details mentioned in this embodiment are applicable in the first to ninth embodiments.

An eleventh embodiment of this application relates to an electrical control device detection method. This embodiment exemplifies an implementation. In this implementation, when the detection circuit adopts the detection circuit mentioned in the second embodiment, the control module obtains a first electrical signal at a third end of a first detection module; and determines, based on the first electrical signal at the third end of the first detection module, whether a fault occurs in a drive circuit of the electrical control device.

Figure 15:
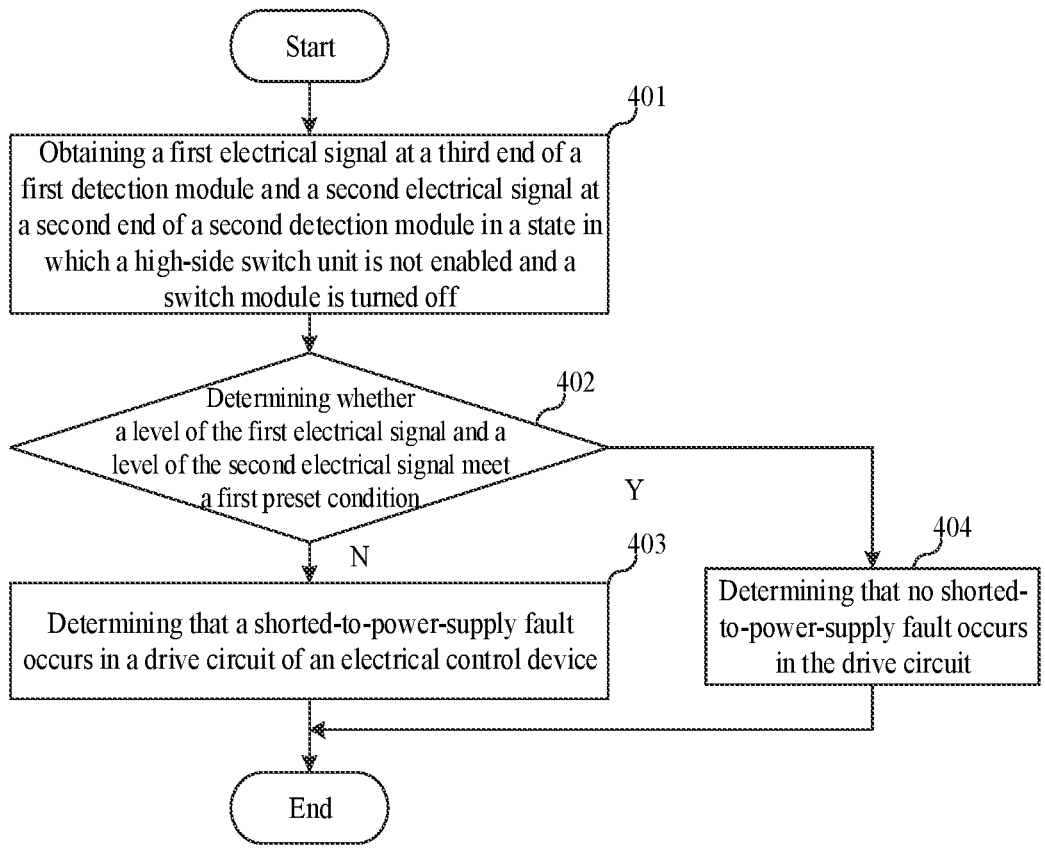
FIG. 15 is a flowchart of an electrical control device detection method according to an eleventh embodiment of this application.

Specifically, as shown in FIG. 15, the detection method in this embodiment includes the following steps.

Step 401: obtaining a first electrical signal at a third end of a first detection module and a second electrical signal at a second end of a second detection module in a state in which a high-side switch unit is not enabled and a switch module is turned off.

Step 402: determining whether a level of the first electrical signal and a level of the second electrical signal meet a first preset condition.

Specifically, the first preset condition is that the level of the first electrical signal is a preset first level, and, the level of the second electrical signal is a preset second level. If a determining result is that the level of the first electrical signal and the level of the second electrical signal meet the first preset condition, step 403 is performed; or, if a determining result is that the level of the first electrical signal or the level of the second electrical signal does not meet the first preset condition, step 404 is performed.

In an example, the second detection module includes a second power submodule, a second current-limiting submodule, and a switch transistor. The second power submodule is connected to a first end of the switch transistor by the second current-limiting submodule. A second end of the switch transistor is grounded. A control end of the switch transistor serves as the first end of the second detection module. The first end of the switch transistor serves as the second end of the second detection module. If the switch transistor is an N-type transistor, the second level is a low level; or, if the switch transistor is a P-type transistor, the second level is a high level. If the second electrical signal is at the second level after the first switch module is closed, it proves that the switch transistor is enabled, and therefore, it proves that a drive circuit of the electrical control device is normal. If the second electrical signal is not at the second level, it proves that the switch transistor is not enabled, and therefore, a load loop is abnormal.

Step 403: determining that a shorted-to-power-supply fault occurs in the drive circuit of the electrical control device. Then the process ends.

Step 404: determining that no shorted-to-power-supply fault occurs in the drive circuit.

In an example, the switch module is closed if it is determined that no shorted-to-power-supply fault occurs in the drive circuit. The control module obtains a third electrical signal at the third end of the first detection module and a fourth electrical signal at the second end of the second detection module in a state in which the switch module is closed; determines whether a level of the third electrical signal and a level of the fourth electrical signal meet a second preset condition, where the second preset condition is that the level of the third electrical signal is not the first level, and, the level of the fourth electrical signal is not the second level; and determines, if a determining result is that the level of the third electrical signal and the level of the fourth electrical signal meet the second preset condition, that a shorted-to-ground fault occurs in the drive circuit.

Optionally, if the level of the third electrical signal and the level of the fourth electrical signal do not meet the second preset condition, the control module determines that the drive circuit is normal.

In an example, after it is determined that no shorted-to-power-supply fault occurs in the drive circuit, the drive power module may be detected. Specifically, the control module obtains a fifth electrical signal at the second end of the third detection module when the high-side switch unit is not enabled, and determines whether voltage of the fifth electrical signal is within a preset range. If it is determined that the voltage of the fifth electrical signal is not within the preset range, the control module determines that the drive power module is abnormal; or, if the voltage of the fifth electrical signal is within the preset range, the control module determines that the drive power module is normal. When the drive power module is normal, the voltage of the electrical signal at the first end of the high-side switch unit is close to an output voltage of the drive power module. Therefore, if the drive power module is abnormal, the voltage of the electrical signal at the first end of the high-side switch unit is far higher or far lower than the output voltage of the drive power module. Therefore, the control module can determine, based on the voltage of the fifth electrical signal, whether the drive power module is normal.

It needs to be noted that, a person skilled in the art understands that the preset range may be determined based on a power supply voltage of the drive power module. For example, the preset range is (power supply voltage of the drive power module−M, power supply voltage of the drive power module+M), where M is a positive number greater than 0.

Apparently, this embodiment is a method embodiment corresponding to the second embodiment. This embodiment may be implemented in coordination with the second embodiment. Relevant technical details mentioned in the second embodiment are still applicable to this embodiment. For brevity, the details are omitted here. Correspondingly, the relevant technical details mentioned in this embodiment are applicable in the second embodiment.

A twelfth embodiment of this application relates to an electrical control device detection method. This embodiment exemplifies an implementation. In this implementation, when the detection circuit adopts the detection circuit mentioned in the second embodiment, the control module obtains a first electrical signal at a third end of a first detection module; and determines, based on the first electrical signal at the third end of the first detection module, whether a fault occurs in a drive circuit of the electrical control device.

Figure 16:
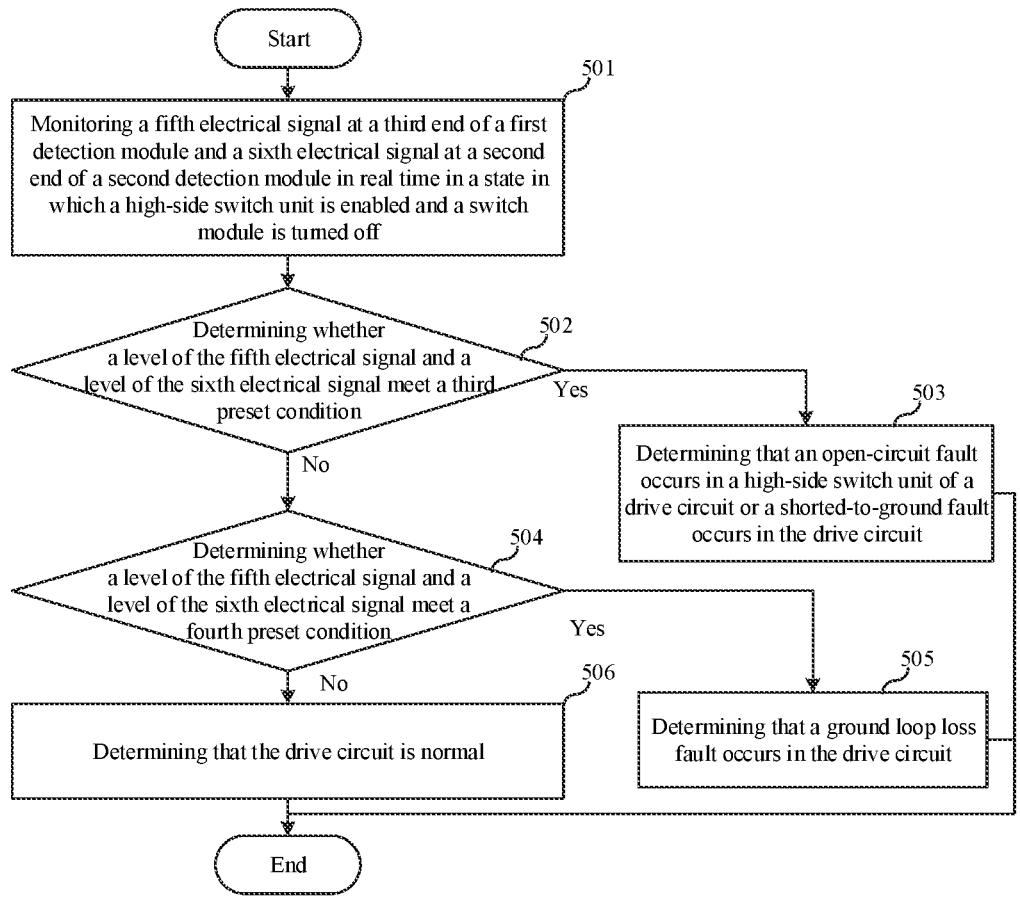
FIG. 16 is a flowchart of an electrical control device detection method according to a twelfth embodiment of this application.

Specifically, as shown in FIG. 16, the electrical control device detection method includes the following steps.

Step 501: monitoring a fifth electrical signal at a third end of a first detection module and a sixth electrical signal at a second end of a second detection module in real time in a state in which a high-side switch unit is enabled and a switch module is turned off.

Step 502: determining whether a level of the fifth electrical signal and a level of the sixth electrical signal meet a third preset condition.

Specifically, the third preset condition is that a level of the fifth electrical signal is not a first level, and a level of the sixth electrical signal is not a second level. If a determining result is that the level of the fifth electrical signal and the level of the sixth electrical signal meet the third preset condition, step 503 is performed; or, if a determining result is that the level of the fifth electrical signal or the level of the sixth electrical signal does not meet the third preset condition, step 504 is performed.

Step 503: determining that an open-circuit fault occurs in a high-side switch unit of a drive circuit or a shorted-to-ground fault occurs in the drive circuit. Then the process ends.

Step 504: determining whether a level of the fifth electrical signal and a level of the sixth electrical signal meet a fourth preset condition.

Specifically, the fourth preset condition is that the level of the fifth electrical signal is not a first level, and the level of the sixth electrical signal is a second level. If a determining result is that the level of the fifth electrical signal and the level of the sixth electrical signal meet the fourth preset condition, step 505 is performed; or, if a determining result is that the level of the fifth electrical signal or the level of the sixth electrical signal does not meet the fourth preset condition, step 506 is performed.

Step 505: determining that a ground loop loss fault occurs in the drive circuit. Then the process ends.

Specifically, the ground loop loss fault means that a connection between the second end of the electrical control device 20 and a reference potential point (ground) is invalid. A possible cause for the ground loop loss fault may be that the reference potential point is faulty.

Step 506: determining that the drive circuit is normal.

Apparently, this embodiment is a method embodiment corresponding to the second embodiment. This embodiment may be implemented in coordination with the first embodiment. Relevant technical details mentioned in the first embodiment are still applicable to this embodiment. For brevity, the details are omitted here. Correspondingly, the relevant technical details mentioned in this embodiment are applicable in the first embodiment.

Figure 17:
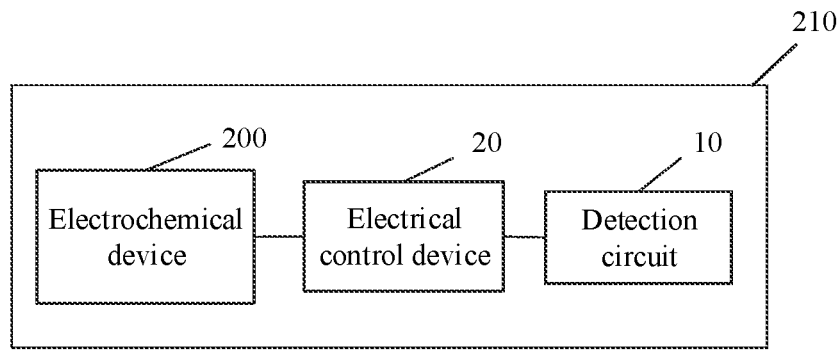
FIG. 17 is a schematic structural diagram of an electric vehicle according to an embodiment of this application.

An embodiment of this application further provides an electric vehicle. As shown in FIG. 17, the electric vehicle 210 includes an electrochemical device 200, an electrical control device 20, and any detection circuit 10 described in the foregoing embodiments. The electrochemical device may be a battery pack that provides electrical power for the electric vehicle. The electrical control device may be a relay or another device that uses a low current to control its status. The detection circuit is configured to detect a drive circuit of the electrical control device. The drive circuit of the electrical control device may include a drive power module and a switch unit. The switch unit includes a high-side switch unit. The specific composition of the detection circuit is omitted here because it has been described in detail in the foregoing embodiments.

The arrangement of steps in each method described above is merely for clarity of description. During implementation, the steps may be combined into one step or some steps may be divided into a plurality of steps, and the combination and division fall within the protection scope of this patent as long as the same logical relationship is incorporated. Adding insignificant modifications and introducing insignificant design into an algorithm or process herein without changing the core design of the algorithm and process fall within the protection scope of this patent.

A person of ordinary skill in the art understands that the embodiments described above are detailed embodiments for implementing this application. In practical applications, various modifications may be made in form and detail to the embodiments without departing from the spirit and scope of this application.

What is claimed is:

1. An apparatus, comprising:
 a detection circuit,
 an electrical control device, and
 a drive circuit of the electrical control device,
 wherein the drive circuit of the electrical control device comprises a drive power module and a high-side switch unit, the drive power module is connected to the high-side switch unit, the high-side switch unit is connected to a first end of the electrical control device and a second end of the electrical control device is grounded;
 wherein the detection circuit comprises a first detection module and a control module; a first end of the first detection module is connected to the first end of the electrical control device, a second end of the first detection module is connected to the second end of the electrical control device, and a third end of the first detection module is connected to the control module; and
 wherein the control module is configured to:
  obtain a first electrical signal at the third end of the first detection module; and
  determine, based on the first electrical signal, whether a fault occurs in the drive circuit of the electrical control device.

2. The apparatus according to claim 1, wherein the detection circuit further comprises a detection power module, a switch module, and a second detection module;
 wherein the detection power module is connected to the a first end of the switch module, a second end of the switch module is connected to the first end of the electrical control device, a first end of the second detection module is connected to the first end of the electrical control device, and a second end of the second detection module is connected to the control module.

3. The apparatus according to claim 2, wherein the detection power module comprises a third power submodule and a voltage divider submodule, the third power submodule is connected to a first end of the voltage divider submodule, and a second end of the voltage divider submodule is connected to the switch module.

4. The apparatus according to claim 1, wherein the first detection module comprises:
   a first power submodule,
   a first current-limiting submodule, and
   a switch element;
wherein
   the first power submodule is connected to a first end of the current-limiting submodule, a first end of the switch element serves as the first end of the first detection module,
   a second end of the switch element serves as the second end of the first detection module,
   a third end of the switch element is connected to a second end of the first current-limiting submodule and serves as the third end of the first detection module, and
   a fourth end of the switch element is grounded;
   wherein, when a current flows from the first end of the switch element to the second end of the switch element, an electrically conductive path is formed between the third end of the switch element and the fourth end of the switch element.

5. The apparatus according to claim 1, wherein the detection circuit further comprises a filter module, a first end of the filter module is connected to the third end of the first detection module, and a second end of the filter module is connected to the control module.

6. The apparatus according to claim 1, wherein the first detection module comprises:
   a first power submodule,
   a filter submodule,
   a first current-limiting submodule, and
   a switch element;
wherein
   the first power submodule is connected to a first end of the current-limiting submodule,
   a first end of the switch element serves as the first end of the first detection module,
   a second end of the switch element serves as the second end of the first detection module,
   a third end of the switch element is connected to a second end of the first current-limiting submodule,
   a fourth end of the switch element is connected to a first end of the filter submodule,
   a second end of the filter submodule is grounded, and
   a third end of the filter submodule serves as the third end of the first detection module.

7. The apparatus according to claim 1, wherein the detection circuit further comprises a first current-limiting module a first end of the first current-limiting module is connected to the first end of the first detection module, and a second end of the first current-limiting module is connected to the first end of the electrical control device.

8. The apparatus according to claim 2, wherein the second detection module comprises:
   a second power submodule,
   a second current-limiting submodule, and
   a switch transistor,
wherein
   the second power submodule is connected to a first end of the second current-limiting submodule,
   a first end of the switch transistor is connected to a second end of the second current-limiting submodule and serves as the second end of the second detection module,
   a second end of the switch transistor is grounded, and
   a control end of the switch transistor serves as the first end of the second detection module.

9. The apparatus according to claim 2, wherein the detection circuit further comprises a second current-limiting module, a first end of the second current-limiting module is connected to the second end of the second detection module, and a second end of the second current-limiting module is connected to the control module.

10. The apparatus according to claim 2, further comprising a freewheeling module, wherein the freewheeling module is parallel-connected to the electrical control device.

11. The apparatus according to claim 2, wherein the control module comprises a processing submodule and a first multiplexer submodule,
   wherein a first end of the first multiplexer submodule is connected to the processing submodule,
   a second end of the first multiplexer submodule is connected to the third end of the first detection module, and
   a third end of the first multiplexer submodule is connected to the second end of the second detection module.

12. The electrical control device detection circuit according to claim 11, wherein the control module further comprises a second multiplexer submodule, and the processing submodule is connected to the high-side switch unit of the electrical control device by the second multiplexer submodule.

13. The electrical control device detection circuit according to claim 1, wherein the control module comprises a processing submodule and a second multiplexer submodule, and the processing submodule is connected to the high-side switch unit of the electrical control device by the second multiplexer submodule.

14. A method for detecting a fault in a drive circuit of an electrical control device by a control module of a detection circuit, wherein the detection circuit comprises a first detection module and the control module; a first end of the first detection module is connected to a first end of the electrical control device, a second end of the first detection module is connected to a second end of the electrical control device, and a third end of the first detection module is connected to the control module; and wherein the drive circuit of the electrical control device comprises a drive power module and a high-side switch unit, the drive power module is connected to the high-side switch unit, the high-side switch unit is connected to the first end of the electrical control device, and the second end of the electrical control device is grounded;
wherein the method comprises:
   obtaining a first electrical signal at the third end of the first detection module; and
   determining, based on the first electrical signal, whether a fault occurs in the drive circuit of an electrical control device.

15. The method according to claim 14, wherein the detection circuit further comprises a detection power module, a switch module, and a second detection module; the detection power module is connected to the a first end of the switch module, a second end of the switch module is connected to the first end of the electrical control device, a first end of the second detection module is connected to the first end of the electrical control device, and a second end of the second detection module is connected to the control module;
wherein obtaining the first electrical signal at the third end of the first detection module and determining, based on the first electrical signal, whether a fault occurs in the drive circuit of the electrical control device comprise:

obtaining the first electrical signal at the third end of the first detection module in a case in which the high-side switch unit is not enabled and the switch module is turned off; and if the first electrical signal is at a preset first level, determining that a shorted-to-power-supply fault occurs in the drive circuit; or, if the first electrical signal is not at the preset first level, determining that no shorted-to-power-supply fault occurs in the drive circuit;

or obtaining the first electrical signal at the third end of the first detection module in a case in which the high-side switch unit is closed or the switch module is closed; and if the first electrical signal at is at the preset first level, determining that no shorted-to-ground fault occurs in the drive circuit; or, if the first electrical signal is not at the preset first level, determining that a shorted-to-ground fault occurs in the drive circuit.

16. The method according to claim 14, wherein the detection circuit further comprises a detection power module, a switch module, and a second detection module; the detection power module is connected to the a first end of the switch module, a second end of the switch module is connected to the first end of the electrical control device, a first end of the second detection module is connected to the first end of the electrical control device, and a second end of the second detection module is connected to the control module;

wherein obtaining the first electrical signal at the third end of the first detection module and determining, based on the first electrical signal, whether a fault occurs in a drive circuit of the electrical control device comprise:

obtaining the first electrical signal at the third end of the first detection module and a second electrical signal at the second end of the second detection module in a state in which the high-side switch unit is not enabled and the switch module is turned off;

determining whether a level of the first electrical signal and a level of the second electrical signal meet a first preset condition, wherein the first preset condition is that the level of the first electrical signal is at a preset first level, and the level of the second electrical signal is at a preset second level; and if the level of the first electrical signal and the level of the second electrical signal meet the first preset condition, determining that a shorted-to-power-supply fault occurs in the drive circuit; or if the level of the first electrical signal or the level of the second electrical signal does not meet the first preset condition, determining that no shorted-to-power-supply fault occurs in the drive circuit.

17. The method according to claim 16, further comprising:

after it is determined that no shorted-to-power-supply fault occurs in the drive circuit, obtaining a third electrical signal at the third end of the first detection module and a fourth electrical signal at the second end of the second detection module in a state in which the switch module is closed;

determining whether a level of the third electrical signal and a level of the fourth electrical signal meet a second preset condition, wherein the second preset condition is that the level of the third electrical signal is not at the preset first level, and the level of the fourth electrical signal is not at the preset second level; and if the level of the third electrical signal and the level of the fourth electrical signal meet the second preset condition, determining that a shorted-to-ground fault occurs in the drive circuit.

18. The electrical control device detection method according to claim 14, wherein, when the control module is connected to the detection circuit according to claim 2, the obtaining a first electrical signal at a third end of a first detection module and determining, based on the first electrical signal at the third end of the first detection module, whether a fault occurs in a drive circuit of the electrical control device specifically comprise:

monitoring a fifth electrical signal at the third end of the first detection module and a sixth electrical signal at a second end of a second detection module in real time in a state in which the high-side switch unit is enabled and a switch module is turned off; and determining, if it is determined that a level of the fifth electrical signal is not a first level and a level of the sixth electrical signal is not a second level, that an open-circuit fault occurs in a high-side switch unit of the drive circuit or a shorted-to-ground fault occurs in the drive circuit; or determining, if it is determined that a level of the fifth electrical signal is not a first level but a level of the sixth electrical signal is a second level, that a ground loop loss fault occurs in the drive circuit.

19. An electric vehicle, comprising:
an electrochemical device,
an electrical control device,
a drive circuit of the electrical control device, and
a detection circuit;

wherein the drive circuit of the electrical control device comprises a drive power module and a high-side switch unit, the drive power module is connected to the high-side switch unit, the high-side switch unit is connected to a first end of the electrical control device, and a second end of the electrical control device is grounded;

wherein the detection circuit comprises a first detection module and a control module; a first end of the first detection module s connected to the first end of the electrical control device, a second end of the first detection module is connected to the second end of the electrical control device, and a third end of the first detection module is connected to the control module; and wherein the control module is configured to:
obtain a first electrical signal at the third end of the first detection module; and
determine, based on the first electrical signal at the third end of the first detection module, whether a fault occurs in the drive circuit of the electrical control device.

* * * * *